(12) United States Patent
Roach

(10) Patent No.: US 7,202,748 B2
(45) Date of Patent: Apr. 10, 2007

(54) ULTRA-WIDEBAND CONSTANT GAIN CMOS AMPLIFIER

(75) Inventor: Steven D. Roach, Colorado Springs, CO (US)

(73) Assignee: Linear Technology Corporation, Milpitas, CA (US)

( * ) Notice: Subject to any disclaimer, the term of this patent is extended or adjusted under 35 U.S.C. 154(b) by 0 days.

(21) Appl. No.: 11/518,027

(22) Filed: Sep. 8, 2006

(65) Prior Publication Data

US 2007/0001769 A1    Jan. 4, 2007

Related U.S. Application Data

(63) Continuation of application No. 11/183,289, filed on Jul. 14, 2005, now Pat. No. 7,123,097, which is a continuation of application No. 10/613,420, filed on Jul. 3, 2003, now Pat. No. 6,946,914, which is a continuation of application No. 10/172,874, filed on Jun. 13, 2002, now Pat. No. 6,670,850.

(51) Int. Cl.
*H03F 3/04* (2006.01)
(52) U.S. Cl. .................................. 330/305; 330/141
(58) Field of Classification Search ............... 330/305, 330/141, 281, 302; 333/214; 327/8, 21, 327/113
See application file for complete search history.

(56) References Cited

U.S. PATENT DOCUMENTS

| | | | |
|---|---|---|---|
| 3,486,126 A | 12/1969 | Chin et al. | |
| 3,573,644 A | 4/1971 | Evel | |
| 3,717,820 A | 2/1973 | Garcia et al. | |
| 3,769,604 A | 10/1973 | Atkinson | |
| 4,409,557 A | 10/1983 | Sechi | |
| 5,121,075 A | 6/1992 | Roach | |
| 5,276,406 A | 1/1994 | Samay et al. | |
| 6,249,186 B1 | 6/2001 | Ebihara et al. | |
| 6,275,113 B1 * | 8/2001 | Nakano et al. | 330/305 |
| 6,392,492 B1 | 5/2002 | Yuan | |
| 6,509,799 B1 * | 1/2003 | Franca-Neto | 330/305 |
| 6,511,432 B2 | 1/2003 | Moore et al. | |
| 6,963,247 B2 * | 11/2005 | Sivonen et al. | 330/302 |

OTHER PUBLICATIONS

Addis, John, "Three technologies on one chip make a broadband amplifier", *Electronics The International Magazine of Electronics Technology*, Jun. 5, 1972, pp. 103-107.

Ahuja, B.K., "Implementation of Active Distributed AC Anti-Aliasing/Smoothing Filters", *IEEE Journal of Solid-State Circuits*, vol. SC-17, No. 6, pp. 1076-1080.

(Continued)

*Primary Examiner*—Henry Choe
(74) *Attorney, Agent, or Firm*—Fish & Neave IP Group Ropes & Gray LLP; Robert W. Morris; Jeffrey D. Mullen

(57) ABSTRACT

Circuitry and methods for improved amplifiers with large bandwidth and constant gain are provided. The combination of a synthetic inductive drain load and a bridged-T matching network provide amplifiers that can drive a substantial capacitive load with the above mentioned improvements over prior amplifiers. Additionally, circuits presented allow for improved rise time and insensitivity to temperature variations.

25 Claims, 7 Drawing Sheets

OTHER PUBLICATIONS

Dascher, David J., "Measuring Parasitic Capacitance and Inductance Using TDR", *Hewlett-Packard Journal*, Apr. 1996, pp. 1-12.

Ikalainen, Pertti, K. "An RLC Matching Network and Application in 1-20 GHZ Monolithic Amplifier", *IEEE MTT-S International Microwave Symposium Digest*, vol. 1, 1989, pp. 1115-1118.

Khoury, John, M., "Synthesis of Arbitrary Rational Transfer Funtions is S Using Uniform Distributed RC Active Circuits", *IEEE Transactions on Circuits and Systems*, vol. 37, No. 4, Apr. 1990, pp. 464-472.

Khoury, John, M., "On the Design of Constant Settling Time AGC Circuits", *IEEE Transactions on Circuits and Systems*, vol. 45, No. 3, Mar. 1998, pp. 283-294.

Maxium, "Interfacing Maxim Laser Drivers with Laser Diodes", May 2000, pp. 1-12.

Sackinger, Eduard, et al., "A 3GHz, 32dB CMOS Limiting Amplifier for SONET OC-48 Receivers", IEEE International Solid-State Circuits Conference, 2000, p. 158.

Swartz, R.G. et al., "An Integrated Circuit for Multiplexing and Driving Injection Lasers", IEEE Journal of Solid-State Circuits, vol. SC-17, No. 4, Aug. 1982, pp. 753-760.

AMCO Product Brief 1.0/1.25GBPSVCSELDRIVER, May 10, 1999, pp. 1-3.

Summit Microelectronics, Inc. "Dual Loop Laser Diode Adaptive Power Controller with Look Up Table" (SML2108), Oct. 3, 2001, pp. 1-21.

\* cited by examiner

ULTRA-WIDEBAND CONSTANT GAIN CMOS AMPLIFIER

CROSS-REFERENCE TO RELATED APPLICATIONS

This application is a continuation of U.S. patent application Ser. No. 11/183,289, filed Jul. 14, 2005, now U.S. Pat. No. 7,123,097 which is a continuation of U.S. patent application Ser. No. 10/613,420, filed Jul. 3, 2003 (now U.S. Pat. No. 6,946,914), which is a continuation of U.S. patent application Ser. No. 10/172,874, filed Jun. 13, 2002 (now U.S. Pat. No. 6,670,850), which are hereby incorporated by reference herein in their entirety.

BACKGROUND OF THE INVENTION

This invention relates to improvements for electrical amplifiers. More specifically, this invention relates to circuits and methods for creating amplifiers with improved frequency response characteristics.

Amplifiers are virtually ubiquitous in modern electronic systems. The necessity for amplifiers, and the amplification that they provide, arises because electric signals of interest are often too "weak" for reliable acquisition and subsequent processing. Such operations, however, may be made more reliable by increasing a subject signal's magnitude.

One desirable characteristic of amplifier circuitry is the ability to provide linear amplification (i.e., amplification that allows signal information to be preserved by amplifying the original signal by a known gain). Often, the amplified output signal is identical to the input signal, with the exception of having a larger magnitude and in some instances, phase shifted. Any alteration of the waveform, however, aside from a change in magnitude or phase, is typically considered a distortion of the original signal and frequently produces undesirable results such as quantization errors when creating digital signals. Accordingly, in many applications, a substantially constant signal gain with minimal variation is highly desirable.

For other types of amplifiers, however, such as limiting amplifiers, it, is important to non-linearly amplify the input signal, and thereby produce an output that preserves the timing characteristics of the input signal, but limits signal amplitude. Such amplifiers are commonly employed in high speed transmission systems for digital data. Maximum bandwidth and minimum rise time are desirable to permit the highest possible data rate. Constant gain is desirable so that the input sensitivity is high and the timing variations are small.

Amplifier bandwidth is also of interest to circuit designers. The bandwidth of an amplifier usually signifies the range of frequencies over which the gain for an input signal is substantially constant (or as constant as possible). Generally speaking, the magnitude response of an amplifier resembles a parabola with negative concavity, including a flattened top (nearly a horizontal line at the vertex) between two frequencies, $\omega 1$ and $\omega 2$. Signals whose frequencies are below $\omega 1$ or above $\omega 2$ will experience lower gain, with the gain decreasing as the frequency moves farther away from the range defined by $\omega 1$ and $\omega 2$. The gain of the amplifier over the frequency band defined by $\omega 1$ and $\omega 2$, however, should remain substantially constant. This range of frequencies is referred to as the amplifier bandwidth.

Typically, electrical systems are designed so that the amplifier's operational bandwidth coincides with (or at least partially with) the spectrum of the signals it is designed to amplify. If this condition is not met, amplifiers often distort the frequency spectrum of the input signal, by amplifying different portions of the input signal by different amounts. Accordingly, a large bandwidth, which allows accurate amplification of signals over a wide range of frequencies, is particularly desirable.

One reason conventional amplifiers have frequency limitations is because various components associated with the amplifier respond differently at different frequencies. For example, capacitors and inductors employed in input or feedback networks almost always have frequency dependent reactances. Therefore, special care must be taken to avoid using the amplifier significantly outside of its predetermined bandwidth.

Currently, there are a variety of methods and circuit configurations for amplifying electrical signals. One commonly used topology is the complementary metal-oxide semiconductor (CMOS) amplifier. CMOS amplifiers use a combination of N-channel metal-oxide semiconductor field-effect transistors (MOSFETS) and P-channel MOSFETS in order to produce an amplified signal.

In the past, CMOS and other types of amplifiers have been introduced that make use of various electrical loads in addition to impedance matching. Although such techniques have been capable of providing either relatively large bandwidths or reduced gain variation, both of these benefits could not be achieved simultaneously. Additionally, the rise time associated with these techniques has been far from optimal.

It light of the foregoing, it would therefore be desirable to provide improved amplifiers with extended bandwidth and substantially constant gain. It would also be desirable to provide amplifiers with improved rise time.

SUMMARY OF THE INVENTION

It is therefore an object of the present invention to provide circuits and methods for extending amplifier bandwidth.

It is also an object of the present invention to provide circuits and methods for maintaining a substantially constant gain over an extended bandwidth.

It is another object of the present invention to provide circuits and methods for improving rise time.

These and other objects of the present invention are accomplished in accordance with the principles of the present invention by providing circuits and methods that increase amplifier bandwidth, maintain a substantially constant gain over an extended frequency range, and improve rise time. Amplification is accomplished by using an inductive sourcing circuit in conjunction with a matching network to substantially compensate for capacitive loading. As a result, a load impedance having a relatively large capacitive component can be driven by an amplifier with very high bandwidth and substantially constant gain.

BRIEF DESCRIPTION OF THE DRAWINGS

The above and other objects and advantages of the present invention will be apparent upon consideration of the following detailed description, taken in conjunction with the accompanying drawings, in which like reference characters refer to like parts throughout, and in which.

DETAILED DESCRIPTION OF THE INVENTION

Figure 1:
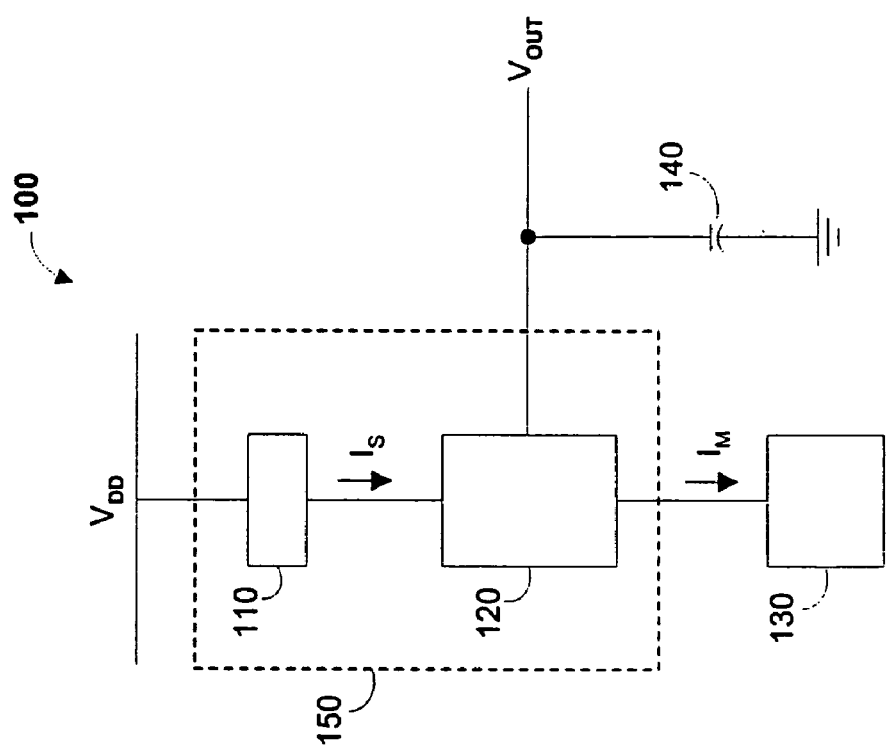
FIG. 1 is a block diagram of an amplifier circuit constructed in accordance with the principles of the present invention.

FIG. 1 is a schematic diagram of an amplifier circuit 100 constructed in accordance with the principles of the present invention. Amplifier circuit 100 includes an inductive sourcing circuit 110, a matching network 120, and a modulation circuit 130.

Capacitor 140 represents the capacitive component of a load driven by circuit 100. Although other arrangements are possible, inductive sourcing circuit 110 and matching network 120 are disposed on a semiconductor die 150. In some embodiments, however, inductors included in matching network 120 may also be formed from material present on a typical integrated circuit or an integrated circuit package (e.g., bond wire, etc.), if desired.

In operation, inductive sourcing circuit 110 provides a source current ($I_S$) to matching network 120. Inductive sourcing circuit 110 may include any circuit configuration that exhibits a substantially inductive frequency characteristic (i.e., impedance that increases as frequency increases) and is suitable for providing current (e.g., such as the circuitry shown in FIG. 2).

Current $I_S$ supplied to the load may be varied by periodically switching modulation circuit 130 ON and OFF, allowing a modulation current ($I_M$) to pass through it during an ON state, and acting as an open circuit during an OFF state. In this way, a voltage differential is applied across the load, including capacitive portion 140 to provide signal modulation. In some embodiments of the present invention, modulation circuit 130 may be configured to turn ON and OFF partially to improve response time. Modulation circuit 130 may include any circuitry suitable for switching between ON and OFF states for digital signals and have a partial switching capability if analog signals are desired (illustrative embodiment shown in FIG. 6).

Inductive sourcing circuit 110 provides at least two important benefits to circuit 100. First, it acts as a high impedance element at high frequencies causing an increasing portion of the output signal produced by amplifier 100 to pass through the load. As a result, the magnitude of the output signal is increased, which improves both the bandwidth and response time of circuit 100. In addition, if circuit 110 is matched with modulation circuit 130, the voltage gain of amplifier 130 remains substantially constant, maintaining the overall gain of amplifier circuit 100 substantially constant. Second, it prevents high frequency signals generated by modulation circuit 130 from being introduced onto a power plane (not shown) coupled to inductive sourcing circuit 110.

As shown in FIG. 1, the bandwidth of amplifier 100 may be further improved by the addition of a broadband matching network 120. Using this configuration, it is possible to compensate for the reactive impedance effects associated with load 140 so that modulation circuit 130 sees a substantially resistive input impedance (i.e., within about +/−5% of a purely resistive impedance characteristic). This may be accomplished in many ways. One way is by selecting certain values for inductors contained in matching network 120 (shown in FIGS. 3, 4 and 6) that satisfy the following equations. For example, the input impedance seen by modulation circuit 130 will be substantially resistive if:

$$Z_0^2 = L/C_N; \text{ and} \quad (1)$$

$$C_{BR} = C_N/4 \quad (2)$$

where $Z_0$ is the resistive component of the impedance of inductive sourcing circuit 110, $C_N$ is the capacitive component of the load impedance, $C_{BR}$ is the capacitance between inductors in matching network 120, and L is the total inductance of the inductors in matching network 120.

Providing the proper inductance values for the inductors in matching network 120 may be accomplished in a number of ways. One method involves the use of a "static compensation" technique. Using this method, a manufacturer determines that a particular amplifier 100 will be used with loads having impedances that fall within a preselected range.

Next, inductors of the proper value are designed from material normally present on an integrated circuit package such as bond wire and/or a package lead. The value of these inductors may be altered by changing the length, width, spacing, or material from which they are constructed. Once designed, the inductors are incorporated into the integrated circuit manufacturing process so that the final product has the inductors present in the integrated circuit package, and thus may compensate for the reactance of loads within the predefined range. This process is known as static compensation due to the difficulty involved with altering the inductance value on the chip after it has been produced.

Another way of providing a specific inductor value involves an "active compensation" technique. With this method, one or more adjustable inductors, such as spiral inductors, are disposed on die 150 of circuit 100 rather than constructing them from packaging materials. After fabrication of the driver circuit is complete, either the manufacturer or a user may adjust the inductors (e.g., by trimming or by using programmable switches to connect or disconnect inductor portions (not shown)) to achieve a desired inductance value.

Thus, as can be seen from the above, combining an inductive sourcing circuit with a broadband matching network in circuit 100 provides increased signal strength and essentially "tunes out" the reactive effects of load impedance thereby substantially increasing bandwidth and gain accuracy as compared to prior art systems From a functional standpoint, this can be viewed as supplying a specified inductance to tune out the frequency effects of load reactance or vice-versa. This may also be viewed as an impedance matching technique whereby the impedance of matching network 120 is selected "match" that of the load. Because the compensation provided by matching network 120 is not frequency dependent, it eliminates the need for cumbersome damping networks. Moreover, the resonant frequency of amplifier circuit 100 is substantially increased, permitting a broader range of high frequency operation. This result is particularly desirable in digital or optical communications systems that constantly strive to accommodate increasing data rates.

Furthermore, it will be understood that matching network 120 may be configured to only partially compensate for (i.e., remain somewhat capacitive) or overcompensate for (i.e., appear inductive) the load reactance, if desired.

Figure 2:
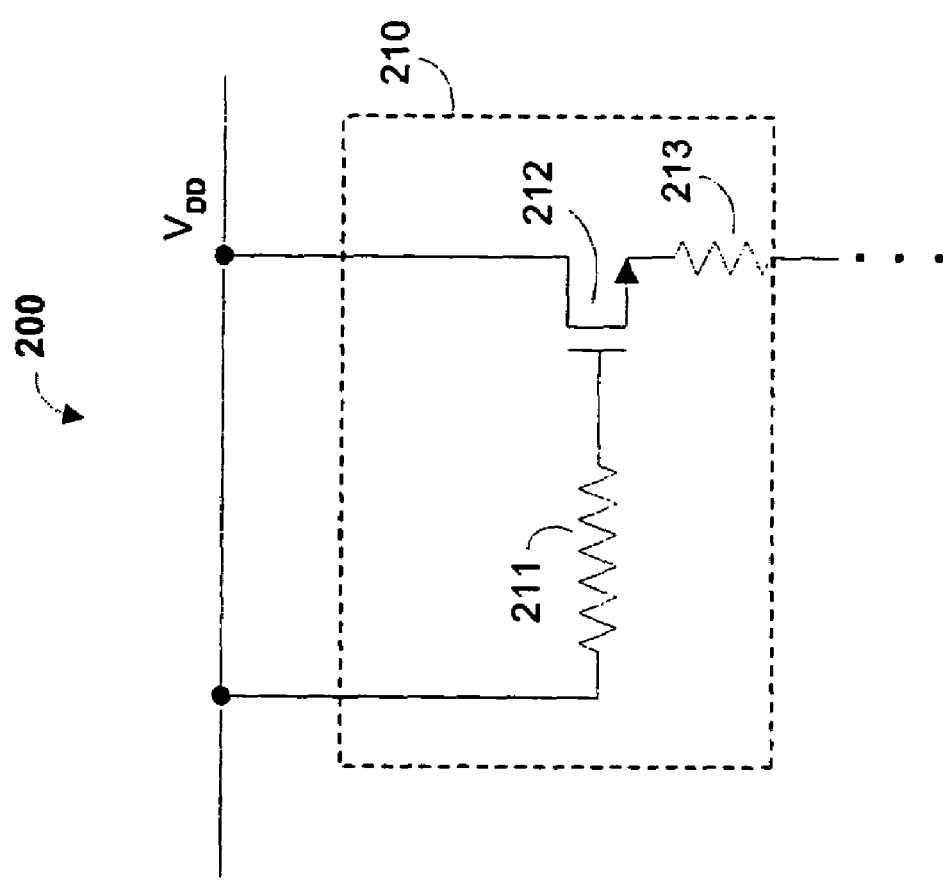
FIG. 2 is a schematic diagram of one embodiment of a synthetic circuit component that exhibits inductive circuit characteristics constructed in accordance with the principles of the present invention.

FIG. 2 shows one embodiment of inductive sourcing circuit 210 constructed in accordance with the principles of the present invention. Arranged as shown, resistor 211 and transistor 212 form a well known drain load that acts as a sourcing circuit with an inductive impedance. In some embodiments, a variable or static resistor 213 may be added to increase (or adjust) the impedance of sourcing circuit 210. Furthermore, it will be appreciated that resistors 211 and 213 may be constructed from transistors such as FETs, if desired.

Although actual inductors may be used in sourcing circuit 110 if desired, using this or a similar circuit configuration which is sometimes referred to as a "synthetic circuit element," often defined as a group of components combined to have certain traits that mimic other components) has certain advantages. For example, as is well known in the art, actual inductors are somewhat difficult to fabricate and tend to use relatively large amounts of die space. By using a synthetic inductor such as the one shown in FIG. 2, it is possible to reduce die size, power consumption, and manufacturing time.

Figure 3:
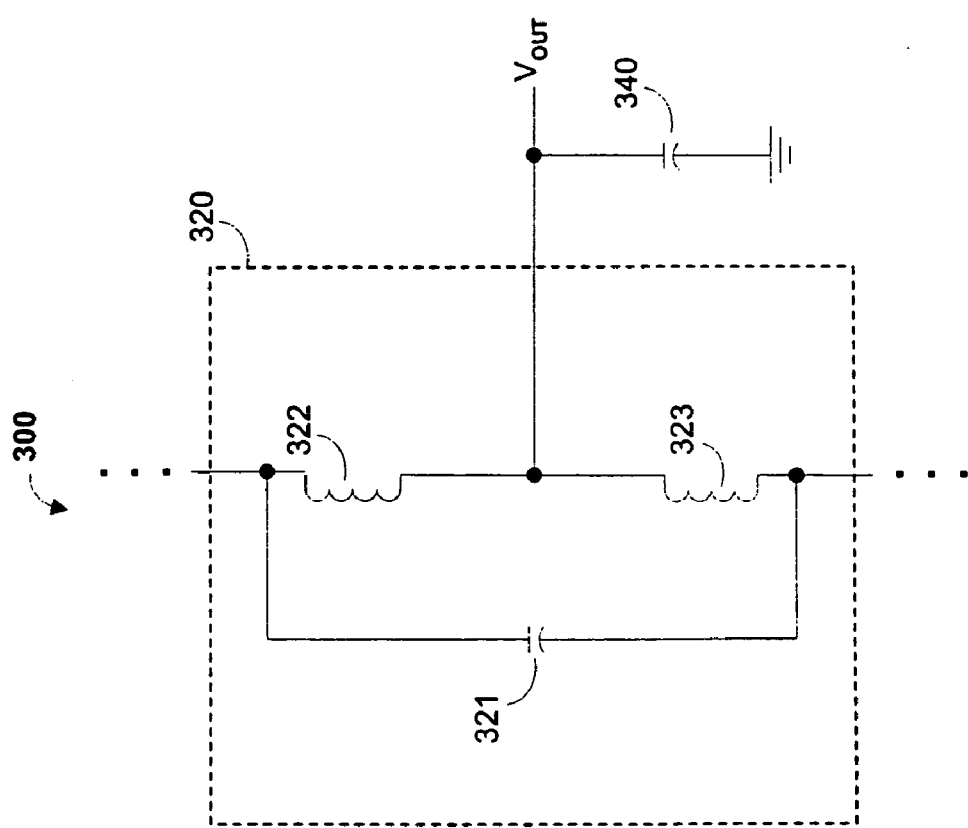
FIG. 3 is a schematic diagram of one embodiment of a matching network constructed in accordance with the principles of the present invention.

FIG. 3 shows one embodiment of a matching network 300 constructed in accordance with the principles of the present invention. As mentioned above, the addition of a broadband network may be used to further improve the bandwidth of amplifier 100. As shown, inductors 322 and 323, together with capacitor 321, form a bridged-T matching network 320. The inductor values may be determined using equations 1 and 2 above. Furthermore, although a bridged T-network is depicted in FIG. 3, it will be understood that any other suitable type of matching network such as a quarter wave transformer or ladder network may be used if desired.

Figure 4:
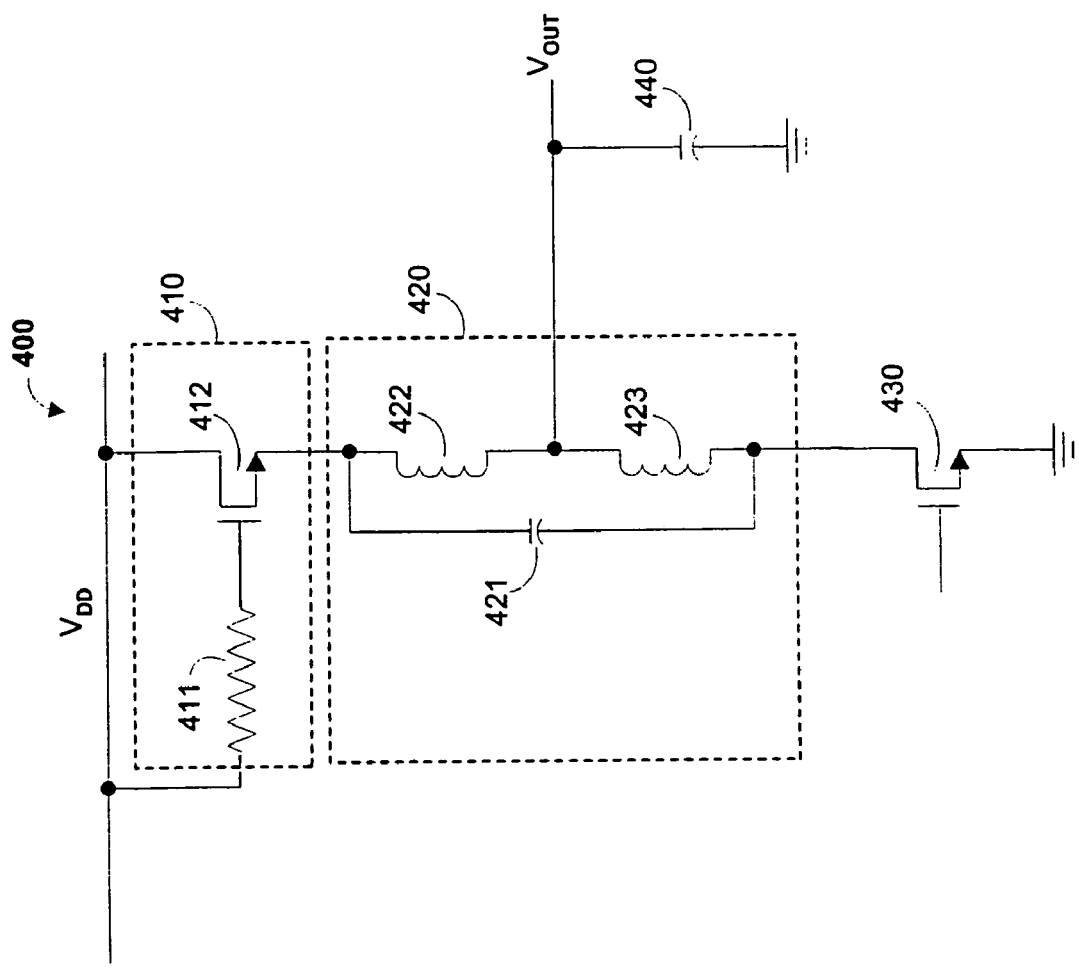
FIG. 4 is a schematic diagram of one embodiment of an amplifier circuit constructed in accordance with the principles of the present invention.

FIG. 4 shows a detailed circuit diagram of an amplifier 400, constructed in accordance with the principles of the present invention, that is capable of providing both a large bandwidth and reduced gain variation, in addition to providing improved rise time and insensitivity to temperature variations.

As shown, amplifier 400 includes inductive sourcing circuit (synthetic inductor) 410, matching network 420, modulating transistor 430 and external capacitive load 440. In accordance with the principles of the present invention, inductive sourcing circuit 410 comprises resistor 411 and transistor 412 as shown in FIG. 4 (the optional resistor shown in FIG. 2 has not been included). Additionally, matching network 420 comprises inductors 422 and 423 and capacitor 421.

The input signal amplified by circuit 400 may be supplied to the gate of transistor 430. Moreover, synthetic inductor 410 and matching network 420 shown in FIG. 4 ensure a wide bandwidth and substantially constant amplification as a result of the impedance matching and cancellation of frequency dependent variations. Gain variations in transistor 430 are largely cancelled by similar variations in transistor 412. Cancellation is particularly effective when transistors 430 and 412 are matched, as in an integrated circuit.

The compensation technique described above, allowing improved characteristics of amplification for a capacitively loaded circuit incorporating CMOS transistors, can also be applied to other types of amplifiers. For example, transistors 212 and 431 can be bipolar junction transistors.

Figure 5:
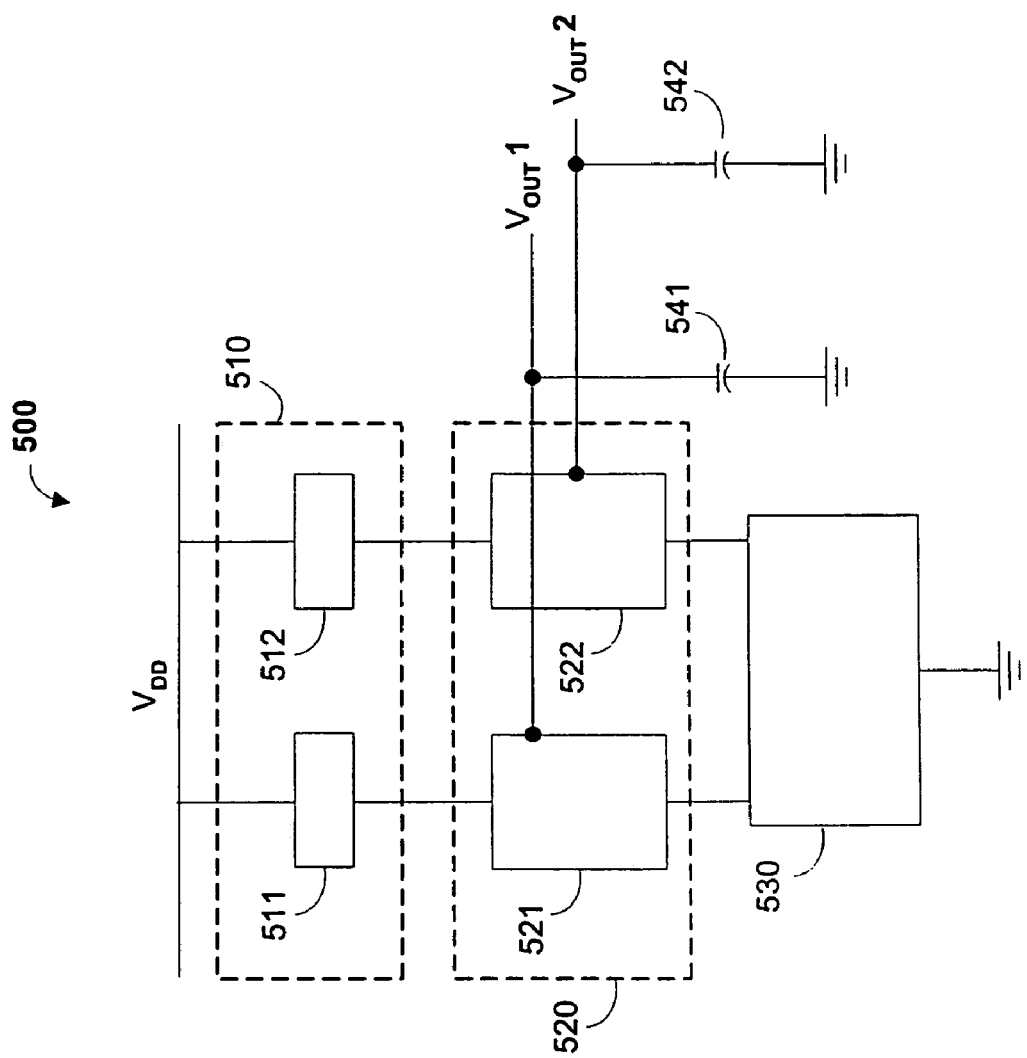
FIG. 5 is a block diagram of one embodiment of a differential amplifier constructed in accordance with the principles of the present invention.

FIG. 5 is an illustrative block diagram of a differential amplifier circuit 500 suitable for driving a capacitive load in accordance with the principles of the present invention. Amplifier 500 includes a supply voltage $V_{DD}$, inductive sourcing circuit 510, matching network 520, modulation circuit 530 and capacitive loads 541 and 542.

Similar to the amplifier of FIG. 1, inductive sourcing circuit 510 and matching network 520 shown in FIG. 5 are used in combination to compensate for the capacitive loading imposed on amplifier 500. Amplifier 500 operates by using inductive sourcing circuits 511 and 512 to provide current to matching networks 521 and 522 that cancel out the frequency dependent variations, thereby providing increased signal strength and a substantially increased bandwidth for differential amplifier 500.

Figure 6:
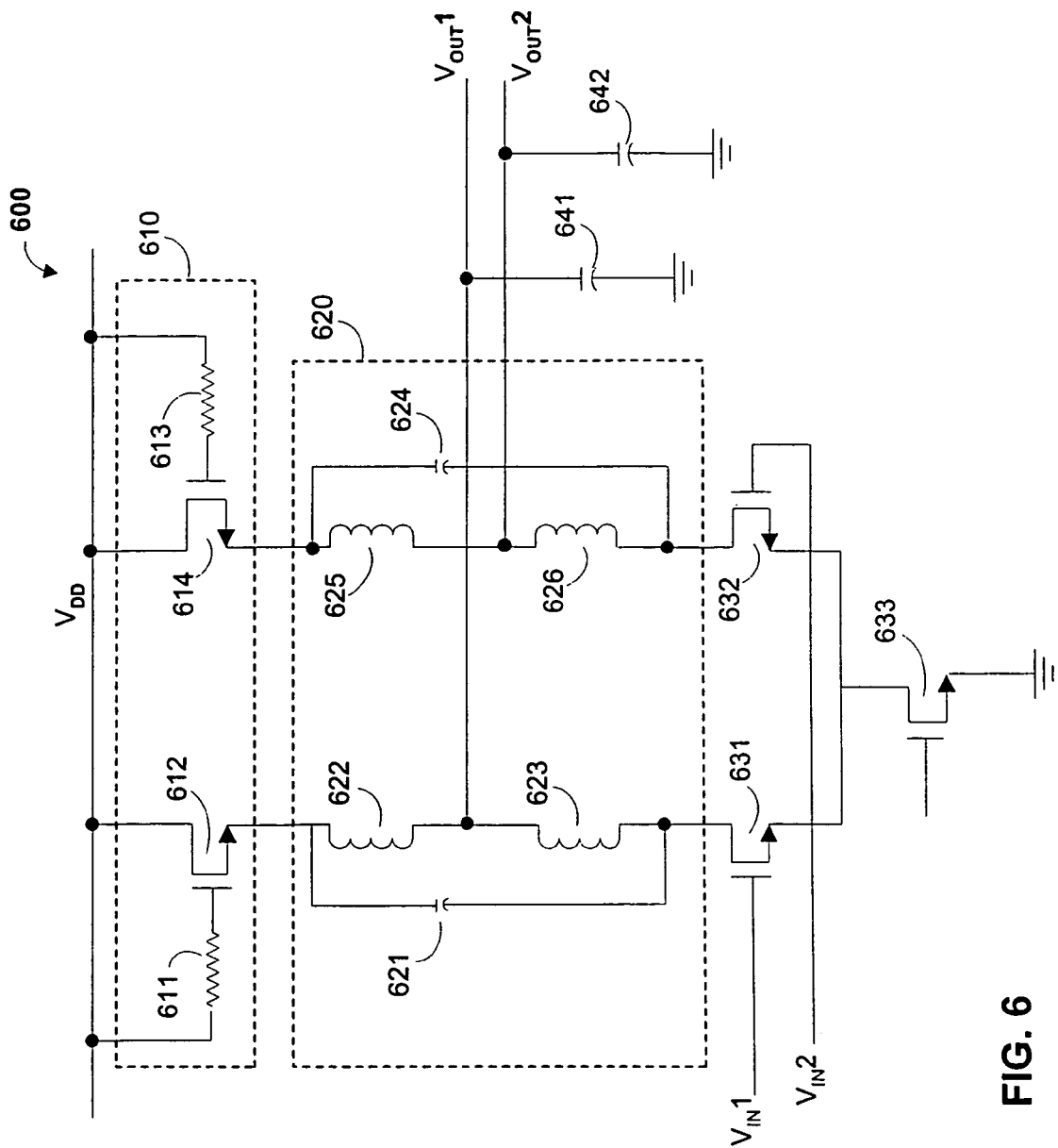
FIG. 6 is a schematic diagram of one embodiment of a differential amplifier constructed in accordance with the principles of the present invention.

FIG. 6 shows a detailed circuit diagram of a CMOS differential amplifier constructed in accordance with the principles of the present invention. The input signals amplified by circuit 600 are supplied to the gates of transistors 631 and 632. Transistor 633 controls the current levels found in each of transistors 612, 614, 631, and 632 and allows amplifier 600 to obtain an optimal bandwidth and limited signal swing at Vout1 and Vout2. Depending on the control signal to biasing transistor 633, the desired level of bandwidth and signal swing can be appropriately selected.

Comparing the present invention to prior art systems with no matching network or inductive sourcing circuit, it can be shown that the bandwidth of the present invention is improved about 70% while the gain variation due to typical semiconductor process tolerances is improved (i.e., reduced) by about a factor of 10.

Finally, as compared with a conventional amplifier with an inductive sourcing circuit and no matching network, it can be shown that the bandwidth of the present invention is improved by about 25%.

Figure 7:
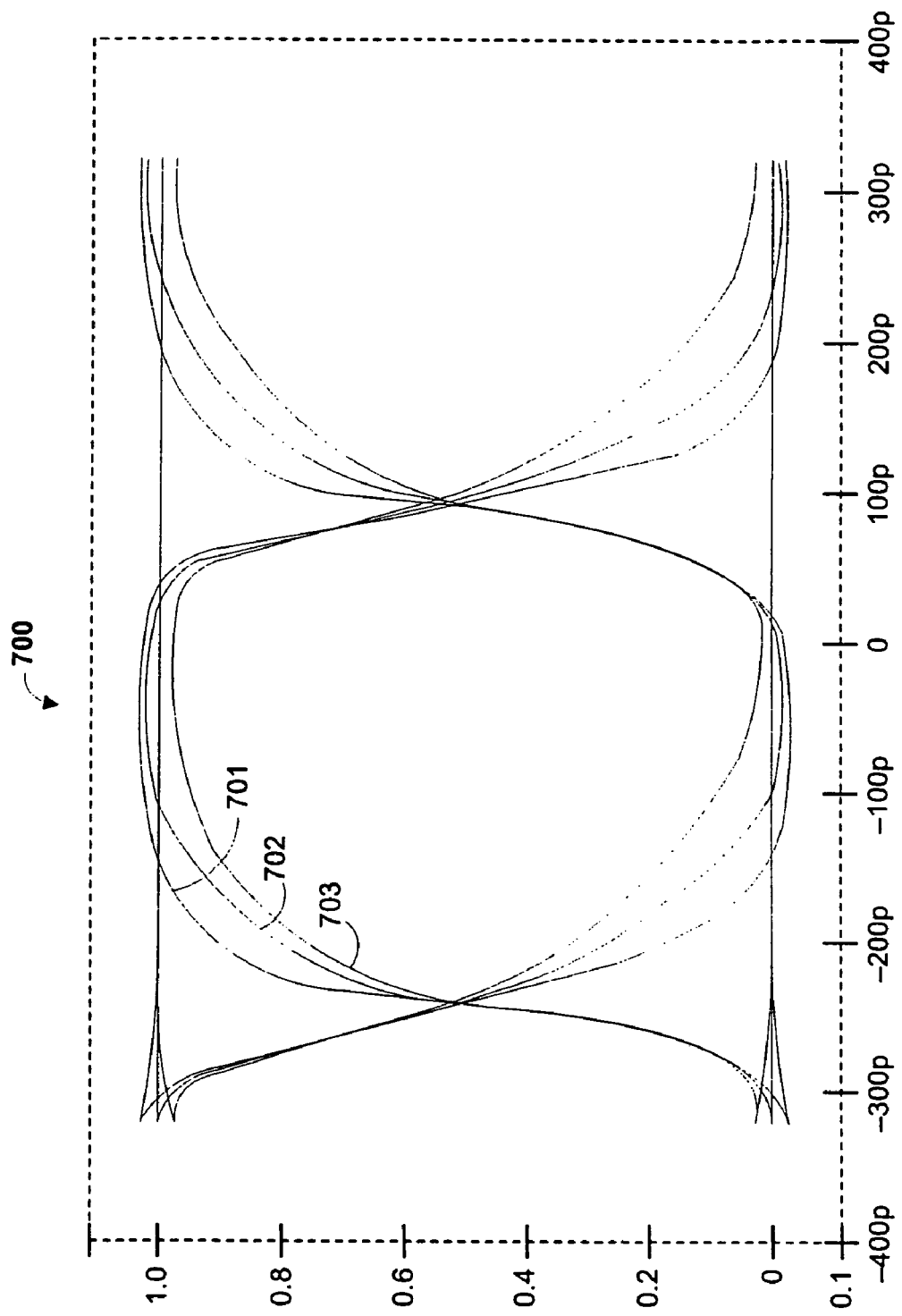
FIG. 7 is an eye diagram illustrating the performance improvements on the present invention as compared to the prior art.

FIG. 7 contains three "eye diagrams" illustrating the advantages of the present invention. Diagram 703 illustrates the frequency response of a conventional amplifier with resistive sourcing circuit and no matching network. Diagram 702 illustrates the frequency response of a conventional amplifier with an inductive sourcing circuit and no matching network. Diagram 701 illustrates the frequency response of an amplifier constructed in accordance with the principles of the present invention.

The purpose of eye diagrams is to help visualize how the transmission of multiple bits of digital data can potentially lead to errors in the interpretation of those bits. In other words, for the case of amplifiers, they help demonstrate the efficiency by which signals are amplified without distortion that may lead to the misrepresentation of bits. For the eye diagrams shown in FIG. 7, a 00111110101100000101 bit sequence at 3.125 Gbps was used.

As can be seen from FIG. 7, the eye diagram of an amplifier in accordance with the principles of the present invention contains a flatter and more "open" pulse shape when compared to the other eye diagrams. Accordingly, the transmission of amplified signals is less prone to errors and the result is an amplifier that provides less gain variation over frequencies within the specified bandwidth. A further benefit as shown by the eye diagrams is the improved rise time associated with the CMOS amplifier of the present invention.

Up to this point, only particular amplifiers and their benefits in accordance with the principles of the present invention have been discussed. However, it will be appreciated that the present invention is also applicable to multi-stage CMOS amplifiers, bipolar junction transistors (BJT)

amplifiers, a combination of the two, as well as other types of multi-stage amplifiers. Moreover, it will be appreciated that the techniques described herein may be combined with a general knowledge of amplifier circuits to produce high interstage bandwidth and minimal gain variation in multi-stage amplifiers, etc.

The above described embodiments of the present invention are presented for purposes of illustration and not of limitation, and the present invention is limited only by the claims which follow.

What is claimed is:

1. A system comprising:
   a power source;
   a first circuit for sourcing current from said power source and for providing a first current, wherein said first circuit comprises a transistor having a source terminal coupled to said power source;
   a second circuit for receiving said first current, wherein said second circuit matches a reactance of a load so that the impedance of said second circuit is substantially the same as the impedance of said load, wherein said second circuit provides a second current; and
   a third circuit for controlling said second current.

2. The system of claim 1, wherein said second circuit comprises:
   a first inductor;
   a second inductor connected in a series configuration with said first inductor; and
   a capacitor connected in parallel to said series configuration.

3. The system of claim 1, wherein said source terminal of said transistor is coupled to a terminal of a resistor.

4. The system of claim 3, wherein said resistor is a variable resistor.

5. The system of claim 3, wherein said transistor is configured to have a substantially inductive impedance.

6. The system of claim 1, wherein said first circuit comprises an inductor.

7. The system of claim 1, wherein said second circuit comprises a broadband matching network.

8. The system of claim 7, wherein said broadband matching network only matches part of said impedance of said load.

9. The method of claim 7 wherein said broadband matching network substantially matches said impedance of said load.

10. The system of claim 1, wherein said second circuit comprises a bridged-T matching network.

11. The system of claim 2, wherein said first inductor and said second inductor are connected to said load.

12. The system of claim 1, wherein said third circuit is a transistor.

13. The system of claim 1, wherein said third circuit controls said second current by drawing a third current from said second circuit, wherein a greater third current corresponds to a smaller second current.

14. The system of claim 13, wherein said second current is greatest when said third current is substantially zero.

15. A system comprising:
    a power source;
    a first circuit for sourcing current from said power source and for providing a first current;
    a second circuit for receiving said first current, wherein said second circuit matches a reactance of a load so that the impedance of said second circuit is substantially the same as the impedance of said load, wherein said second circuit provides a second current; and
    a third circuit for controlling said second current, wherein said third circuit controls said second current by drawing a third current from said second circuit.

16. The system of claim 15, wherein said second circuit comprises:
    a first inductor;
    a second inductor connected in a series configuration with said first inductor; and
    a capacitor connected in parallel to said series configuration.

17. The system of claim 15, wherein said first circuit comprises a transistor having a terminal coupled to said power source.

18. The system of claim 17, wherein said transistor is configured to have a substantially inductive impedance.

19. The system of claim 15, wherein said first circuit comprises an inductor.

20. The system of claim 15, wherein said second circuit comprises a broadband matching network.

21. The system of claim 20, wherein said broadband matching network only matches part of said impedance of said load.

22. The method of claim 20, wherein said broadband matching network substantially matches said impedance of said load.

23. The system of claim 15, wherein said second circuit comprises a bridged-T matching network.

24. The system of claim 15, wherein said third circuit is a transistor.

25. The system of claim 15, wherein said second current is greatest when said third current is substantially zero.

* * * * *